United States Patent
Miller

(10) Patent No.: US 10,283,331 B2
(45) Date of Patent: May 7, 2019

(54) PVD PLASMA CONTROL USING A MAGNET EDGE LIFT MECHANISM

(71) Applicant: APPLIED MATERIALS, INC., Santa Clara, CA (US)

(72) Inventor: Keith A. Miller, Mountain View, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 439 days.

(21) Appl. No.: 14/458,334

(22) Filed: Aug. 13, 2014

(65) Prior Publication Data

US 2015/0075970 A1    Mar. 19, 2015

Related U.S. Application Data

(60) Provisional application No. 61/879,048, filed on Sep. 17, 2013.

(51) Int. Cl.
     *H01J 37/34*      (2006.01)
     *C23C 14/35*      (2006.01)

(52) U.S. Cl.
     CPC .......... *H01J 37/3405* (2013.01); *C23C 14/35* (2013.01); *H01J 37/345* (2013.01); *H01J 37/3452* (2013.01); *H01J 37/3455* (2013.01); *H01J 37/3461* (2013.01)

(58) Field of Classification Search
     CPC ....... C23C 14/35; H01J 25/50; H01J 37/3405; H01J 37/3455; H01J 37/345; H01J 37/3452; H01J 37/3461
     See application file for complete search history.

(56) References Cited

U.S. PATENT DOCUMENTS

| | | | |
|---|---|---|---|
| 6,372,098 B1 * | 4/2002 | Newcomb et al. | 204/192.12 |
| 8,956,512 B2 * | 2/2015 | Mizuno | C23C 14/35 204/192.12 |
| 2006/0065525 A1 * | 3/2006 | Weichart | 204/298.28 |
| 2011/0311735 A1 * | 12/2011 | Wang | C23C 14/35 427/571 |
| 2013/0256125 A1 | 10/2013 | Young et al. | |

(Continued)

FOREIGN PATENT DOCUMENTS

| | | |
|---|---|---|
| JP | 09143713 A * | 6/1997 |
| JP | 2000282234 A * | 10/2000 |

(Continued)

OTHER PUBLICATIONS

Machine Translation JP 2001107228 A.*

*Primary Examiner* — Michael A Band
(74) *Attorney, Agent, or Firm* — Moser Taboada; Alan Taboada

(57) ABSTRACT

Apparatus for providing a magnetic field within a process chamber are provided herein. In some embodiments, an apparatus for providing a magnetic field within a process chamber includes: an inner rotating mechanism including a first plate having a central axis, wherein the first plate includes and a first plurality of magnets and is rotatable about the central axis; and an outer lifting mechanism including a ring disposed proximate the first plate, the ring having a second plurality of magnets coupled to a bottom surface of the ring proximate the peripheral edge of the ring, wherein the ring is movable in a direction perpendicular to the first plate.

19 Claims, 6 Drawing Sheets

(56) References Cited

U.S. PATENT DOCUMENTS

| | | |
|---|---|---|
| 2013/0256127 A1 | 10/2013 | Young et al. |
| 2014/0042023 A1 | 2/2014 | Ritchie et al. |
| 2014/0261175 A1 | 9/2014 | Hanson et al. |
| 2014/0261180 A1 | 9/2014 | Yoshidome et al. |

FOREIGN PATENT DOCUMENTS

| | | | |
|---|---|---|---|
| JP | 2001107228 A | * | 4/2001 |
| JP | 2001158961 A | * | 6/2001 |

* cited by examiner

PVD PLASMA CONTROL USING A MAGNET EDGE LIFT MECHANISM

CROSS-REFERENCE TO RELATED APPLICATIONS

This application claims benefit of U.S. provisional patent application Ser. No. 61/879,048, filed Sep. 17, 2013, which is herein incorporated by reference.

FIELD

Embodiments of the present disclosure generally relate to physical vapor deposition substrate processing systems. In particular, embodiments of the present disclosure relate to a magnetron for use in a physical vapor deposition chamber.

BACKGROUND

Sputtering, alternatively called physical vapor deposition (PVD), has long been used depositing ionized metals from a target in the fabrication of semiconductor integrated circuits. Its use has been extended to depositing metal layers onto the sidewalls of high aspect-ratio holes such as vias or other vertical interconnect structures. Currently, advanced sputtering applications include depositing a metallic seed layer for later electroplating of the metallic layer in the via and depositing a barrier layer on the dielectric material of the via sidewall to prevent the metallic layer from diffusing into the dielectric.

Plasma sputtering may be accomplished using either DC sputtering or RF sputtering. Plasma sputtering typically includes a magnetron positioned at the back of the sputtering target to project a magnetic field into the processing space to increase the density of the plasma and enhance the sputtering rate. Typical magnetrons in some PVD chambers include magnets spinning about a central axis which spreads the plasma out over target surface to enable sputtering. However, these magnetrons don't offer any kind of control of the in the radial direction (i.e., from the center of the target to the edge of the target). Thus, in some areas, the plasma density may not be uniform across the sputtering surface of the target.

Accordingly, the inventors have provided embodiments of improved magnetron assemblies for use in substrate processing systems.

SUMMARY

Apparatus for providing a magnetic field within a process chamber are provided herein. In some embodiments, an apparatus for providing a magnetic field within a process chamber includes: an inner rotating mechanism including a first plate having a central axis, wherein the first plate includes and a first plurality of magnets and is rotatable about the central axis; and an outer lifting mechanism including a ring disposed proximate the first plate, the ring having a second plurality of magnets coupled to a bottom surface of the ring proximate the peripheral edge of the ring, wherein the ring is movable in a direction perpendicular to the first plate.

In some embodiments, a substrate processing system includes: a process chamber having an inner volume and a substrate support disposed therein; a target disposed in an upper portion of the inner volume opposing the substrate support; and a magnetron assembly disposed proximate a back surface of the target on a side opposite the substrate support, the magnetron assembly comprising: an inner rotating mechanism including a first plate having a central axis, wherein the first plate includes and a first plurality of magnets and is rotatable about the central axis; and an outer lifting mechanism including a ring disposed proximate the first plate, the ring having a second plurality of magnets coupled to the ring proximate the peripheral edge of the ring, wherein the ring is movable in a direction perpendicular to the first plate.

In some embodiments, a method of processing a substrate in a physical vapor deposition (PVD) chamber, includes: applying a first RF power at a VHF frequency to a target comprising a metal disposed above the substrate to form a plasma from a plasma-forming gas; applying DC power to the target to direct the plasma towards the target; rotating a first plate of magnetron above the target while directing the plasma towards the target, the first plate of the magnetron having a first plurality of magnets; moving a ring in a direction perpendicular to the first plate above the target to tune a magnetic edge field proximate an outer edge of the target, wherein the ring is disposed proximate the first plate and having a second plurality of magnets coupled to the ring proximate the peripheral edge of the ring; sputtering metal atoms from the target using the plasma; and depositing the ionized metal atoms on the substrate to form a layer thereon.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. It is to be noted, however, that the appended drawings illustrate only typical embodiments of this disclosure and are therefore not to be considered limiting of its scope, for the disclosure may admit to other equally effective embodiments.

Figure 1:
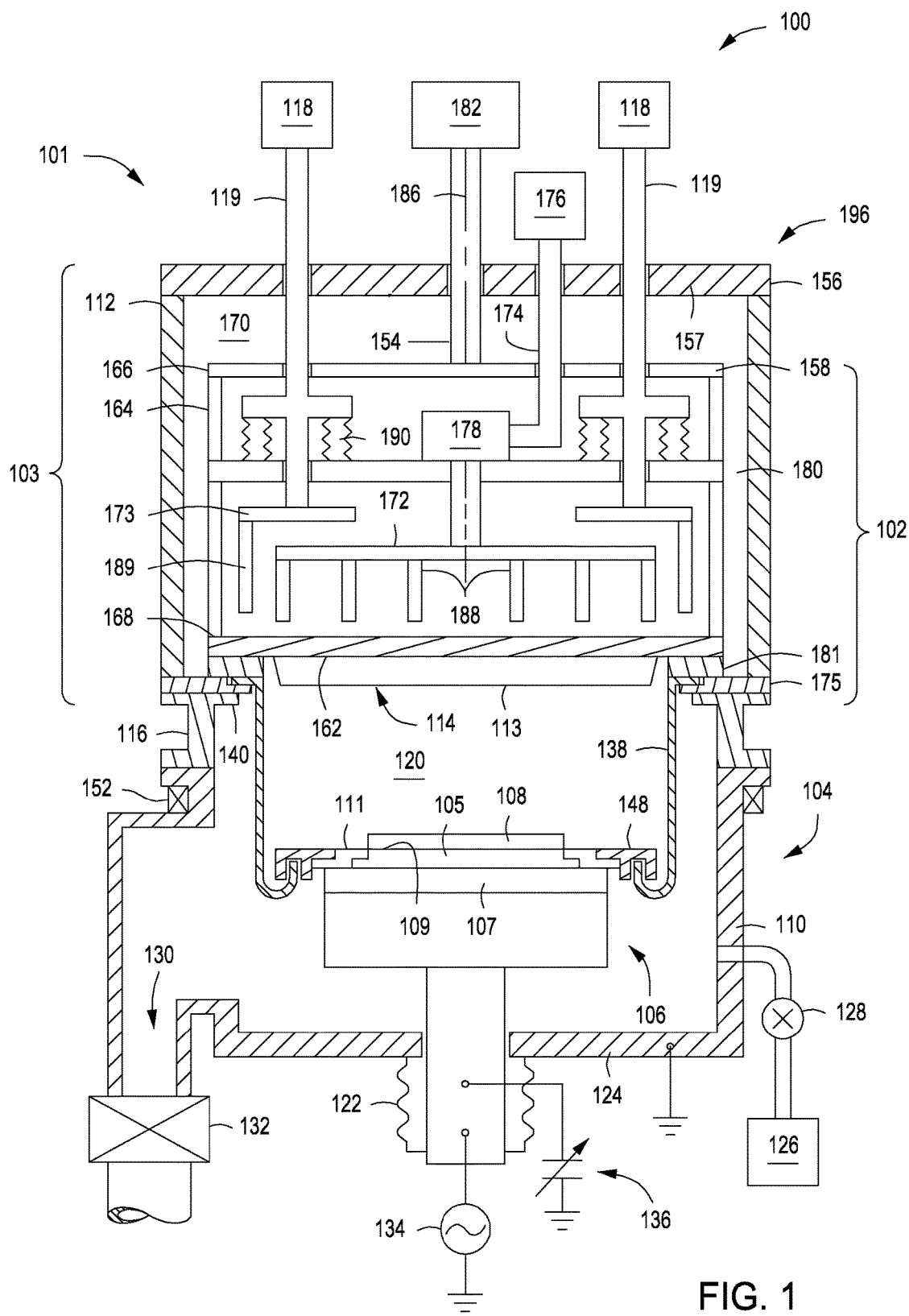
FIG. 1 is a cross-sectional view of an illustrative PVD process chamber having a magnetron assembly in accordance with some embodiments of the present disclosure.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

Embodiments of magnetrons that provide plasma control in a radial direction that can extend target life in PVD substrate processing are provided herein. In some embodiments, the present disclosure provides new apparatus and methods to control film uniformity whilst greatly extending the target life in PVD substrate processing systems. In some embodiments, the present disclosure may facilitate one or more of high target, more uniform metal ionization, and more uniform deposition on a substrate.

Magnetron designs in accordance with embodiment of the present disclosure are described below with respect to an illustrative, but non-limiting, PVD process chamber in FIG. 1, and in greater detail in FIGS. 2A-3C.

FIG. 1 depicts a simplified, cross-sectional view of an illustrative PVD process chamber 100 having a magnetron assembly in accordance with some embodiments of the present disclosure. The specific configuration of the PVD process chamber is illustrative and PVD process chambers having other configurations may also benefit from modification in accordance with the teachings provided herein. Examples of commercially available PVD process chambers suitable for modification in accordance with the teachings provided herein include the ALPS® Plus and SIP ENCORE® PVD processing chambers, both commercially available from Applied Materials, Inc., of Santa Clara, Calif. Other processing chambers from Applied Materials, Inc. or other manufacturers may also benefit from modifications in accordance with the inventive apparatus disclosed herein.

In some embodiments of the present disclosure, the PVD process chamber 100 includes a chamber lid 101 disposed atop a chamber body 104 and removable from the chamber body 104. The chamber lid 101 generally includes a target assembly 102 and a grounding assembly 103. The chamber body 104 contains a substrate support 106 for receiving a substrate 108 thereon. The substrate support 106 is configured to support a substrate such that a center of the substrate is aligned with a central axis 186 of the PVD process chamber 100. The substrate support 106 may be located within a lower grounded enclosure wall 110, which may be a wall of the chamber body 104. The lower grounded enclosure wall 110 may be electrically coupled to the grounding assembly 103 of the chamber lid 101 such that an RF return path is provided to an RF power source 182 disposed above the chamber lid 101. Alternatively, other RF return paths are possible, such as those that travel from the substrate support 106 via a process kit shield (e.g., a shield 138) and ultimately back to the grounding assembly 103 of the chamber lid 101. The RF power source 182 may provide RF energy to the target assembly 102 as discussed below.

The substrate support 106 has a material-receiving surface facing a principal surface of a target 114. The substrate support 106 supports the substrate 108 to be sputter coated with material ejected from the target in planar position opposite to the principal surface of the target 114. The substrate support 106 may include a dielectric member 105 having a substrate processing surface 109 for supporting the substrate 108 thereon. In some embodiments, the substrate support 106 may include one or more conductive members 107 disposed below the dielectric member 105. For example, the dielectric member 105 and the one or more conductive members 107 may be part of an electrostatic chuck, RF electrode, or the like which may be used to provide chucking or RF power to the substrate support 106.

The substrate support 106 may support the substrate 108 in a first volume 120 of the chamber body 104. The first volume 120 is a portion of the inner volume of the chamber body 104 that is used for processing the substrate 108. The first volume 120 may be separated from the remainder of the inner volume (e.g., a non-processing volume) during processing of the substrate 108 (for example, via the shield 138). The first volume 120 is defined as the region above the substrate support 106 during processing (for example, between the target 114 and the substrate support 106 when in a processing position).

In some embodiments, the substrate support 106 may be vertically movable. The vertically movable substrate support 106 allows the substrate 108 to be transferred onto the substrate support 106 through an opening in the lower portion of the chamber body 104 and thereafter raised to a processing position. The opening may be a slit valve, for example. A bellows 122 connected to a bottom chamber wall 124 may be provided to maintain a separation of the inner volume of the chamber body 104 from the atmosphere outside of the chamber body 104. One or more gases may be supplied from a gas source 126 through a mass flow controller 128 into the lower part of the chamber body 104. An exhaust port 130 may be provided and coupled to a pump via a valve 132 for exhausting the interior of the chamber body 104. The exhaust port 130 facilitates maintaining a desired pressure inside the chamber body 104.

An RF bias power source 134 may be coupled to the substrate support 106 in order to induce a negative DC bias on the substrate 108. In addition, in some embodiments, a negative DC self-bias may form on the substrate 108 during processing. In some embodiments, RF energy supplied by the RF bias power source 134 may range in frequency from about 2 MHz to about 60 MHz, for example, non-limiting frequencies such as 2 MHz, 13.56 MHz, or 60 MHz can be used. In other applications, the substrate support 106 may be grounded or left electrically floating. Alternatively or in combination, a capacitance tuner 136 may be coupled to the substrate support 106 for adjusting voltage on the substrate 108 for applications where RF bias power is not be desired.

The chamber body 104 further includes a process kit shield (shield 138) to surround the processing, or first volume, of the chamber body 104. The shield 138 protects other chamber components from damage and/or contamination from processing. In some embodiments, the shield 138 may be coupled to a ledge 140 of an upper grounded enclosure wall 116 of the chamber body 104. In other embodiments, and as illustrated in FIG. 1, the shield 138 may be coupled to the chamber lid 101, for example via a support member 175.

The chamber lid 101 rests on the ledge 140 of the upper grounded enclosure wall 116. Similar to the lower grounded enclosure wall 110, the upper grounded enclosure wall 116 provides a portion of the RF return path between the lower grounded enclosure wall 116 and grounding assembly 103 of the chamber lid 101. However, other RF return paths are possible, such as via the grounded shield 138.

The shield 138 extends downwardly and may include one or more sidewalls configured to surround the first volume 120. The shield 138 extends along, but spaced apart from, the walls of the upper grounded enclosure wall 116 and the lower grounded enclosure wall 110. The shield 138 extends downwardly below a top surface of the substrate support 106 and returns upwardly until reaching a top surface of the substrate support 106 (e.g., forming a u-shaped portion at the bottom of the shield 138). A first ring 148 (e.g., a cover ring) rests on the top of the u-shaped portion (e.g., a first position of the first ring 148) when the substrate support 106 is in its lower, loading position. However, the first ring 148 rests on the outer periphery of the substrate support 106 (e.g., a second position of the first ring 148) when the substrate support 106 is in its upper, deposition position (as illustrated in FIG. 1) to protect the substrate support 106 from sputter deposition.

An additional dielectric ring 111 may be used to shield the periphery of the substrate 108 from deposition. For example, the dielectric ring 111 may be disposed about a peripheral edge of the substrate support 106 and adjacent to the substrate processing surface 109 as illustrated in FIG. 1.

When the first ring 148 is in the second position (e.g., when disposed on the outer periphery of the substrate support 106), a gap may be defined between the first ring 148 and the shield 138. In some embodiments, the gap may be less than about two plasma sheath widths for a plasma formed at a frequency of about 40 MHz or higher and at a pressure of about 140 mTorr or lower. In some embodiments, the width of the gap is less than about 6 millimeters (mm). In some embodiments, the gap has a length to width ratio of at least about 4:1. The inventors have discovered that, in some embodiments, a length to width ratio of at least about 4:1 may advantageously limit or prevent plasma formed in the first volume 120 from reaching a non-processing volume of the inner volume disposed below the substrate support 106.

The first ring 148 may include protrusions extending from a lower surface of the first ring 148 on either side of the inner upwardly extending u-shaped portion of the bottom of the shield 138. An innermost protrusion may be configured to interface with the substrate support 106 to align the first ring 148 with respect to the shield 138 when the first ring 148 is moved into the second position as the substrate support is moved into the processing position. For example, a substrate support facing surface of the innermost protrusion may be tapered, notched or the like to rest in/on a corresponding surface on the substrate support 106 when the first ring 148 is in the second position. The gap formed between the first ring 148 and the shield 138 is defined by the alignment of the first ring 148.

In some embodiments, a magnet 152 may be disposed about the chamber body 104 for selectively providing a magnetic field between the substrate support 106 and the target 114. For example, as shown in FIG. 1, the magnet 152 may be disposed about the outside of the enclosure wall 110 in a region just above the substrate support 106 when in processing position. In some embodiments, the magnet 152 may be disposed additionally or alternatively in other locations, such as adjacent the upper grounded enclosure wall 116. The magnet 152 may be an electromagnet and may be coupled to a power source (not shown) for controlling the magnitude of the magnetic field generated by the electromagnet.

The chamber lid 101 generally includes the grounding assembly 103 disposed about the target assembly 102. The grounding assembly 103 may include a grounding plate 156 having a first surface 157 that may be generally parallel to and opposite a backside of the target assembly 102. A grounding shield 112 may extending from the first surface 157 of the grounding plate 156 and surround the target assembly 102. The grounding assembly 103 may include a support member 175 to support the target assembly 102 within the grounding assembly 103.

In some embodiments, the support member 175 may be coupled to a lower end of the grounding shield 112 proximate an outer peripheral edge of the support member 175. The support member 175 extends radially inward to support a seal ring 181, the target assembly 102 and optionally, a dark space shield (e.g., than may be disposed between the shield 138 and the target assembly 102). The seal ring 181 may be a ring or other annular shape having a desired cross-section. The seal ring 181 may include two opposing planar and generally parallel surfaces to facilitate interfacing with the target assembly 102. For example, the seal ring 181 may include the backing plate 162 on a first side of the seal ring 181 and the support member 175 on a second side of the seal ring 181 to facilitate interfacing with the target assembly. The seal ring 181 may be made of a dielectric material, such as ceramic. The seal ring 181 may insulate the target assembly 102 from the ground assembly 103.

The support member 175 may be a generally planar member having a central opening to accommodate the shield 138 and the target 114. In some embodiments, the support member 175 may be circular, or disc-like in shape, although the shape may vary depending upon the corresponding shape of the chamber lid and/or the shape of the substrate to be processed in the PVD process chamber 100. In use, when the chamber lid 101 is opened or closed, the support member 175 maintains the shield 138 in proper alignment with respect to the target 114, which minimizes the risk of misalignment due to chamber assembly or opening and closing the chamber lid 101.

The target assembly 102 may include a source distribution plate 158 opposing a backside of the target 114 and electrically coupled to the target 114 along a peripheral edge of the target 114. The target 114 may include a target source material 113 to be deposited on a substrate, such as the substrate 108 during sputtering, such as a metal, metal oxide, metal alloy, magnetic material, or the like. In some embodiments, the target 114 may include a backing plate 162 to support the target source material 113. The target source material 113 may be disposed on a substrate support facing side of the backing plate 162 as illustrated in FIG. 1. The backing plate 162 may comprise a conductive material, such as copper-zinc, copper-chrome, or the same material as the target, such that RF, and optionally DC, power can be coupled to the target source material 113 via the backing plate 162. Alternatively, the backing plate 162 may be non-conductive and may include conductive elements (not shown) such as electrical feedthroughs or the like.

A conductive member 164 may be disposed between the source distribution plate and the backside of the target 114 to propagate RF energy from the source distribution plate to the peripheral edge of the target 114. The conductive member 164 may be cylindrical and tubular, with a first end 166 coupled to a target-facing surface of the source distribution plate 158 proximate the peripheral edge of the source distribution plate 158 and a second end 168 coupled to a source distribution plate-facing surface of the target 114 proximate the peripheral edge of the target 114. In some embodiments, the second end 168 is coupled to a source distribution plate facing surface of the backing plate 162 proximate the peripheral edge of the backing plate 162.

The target assembly 102 may include a cavity 170 disposed between the backside of the target 114 and the source distribution plate 158. The cavity 170 may at least partially house a magnetron assembly 196 as discussed below. The cavity 170 is at least partially defined by the inner surface of the conductive member 164, a target facing surface of the source distribution plate 158, and a source distribution plate facing surface (e.g., backside) of the target 114 (or backing plate 162). In some embodiments, the cavity 170 may be at least partially filled with a cooling fluid, such as water ($H_2O$) or the like. In some embodiments, a divider (not shown) may be provided to contain the cooling fluid in a desired portion of the cavity 170 (such as a lower portion, as shown) and to prevent the cooling fluid from reaching components disposed on the other side of the divider.

An insulative gap 180 is provided between the grounding plate 156 and the outer surfaces of the source distribution plate 158, the conductive member 164, and the target 114 (and/or backing plate 162). The insulative gap 180 may be filled with air or some other suitable dielectric material, such as a ceramic, a plastic, or the like. The distance between the grounding plate 156 and the source distribution plate 158 depends on the dielectric material between the grounding plate 156 and the source distribution plate 158. Where the dielectric material is predominantly air, the distance between the grounding plate 156 and the source distribution plate 158 should be between about 5 to about 40 mm.

The grounding assembly 103 and the target assembly 102 may be electrically separated by the seal ring 181. In some embodiments, the grounding assembly 103 and the target assembly 102 may be electrically separated by one or more of insulators 160 disposed between the first surface 157 of the grounding plate 156 and the backside of the target assembly 102, e.g., a non-target facing side of the source distribution plate 158.

The target assembly 102 has the RF power source 182 connected to an electrode 154 (e.g., a RF feed structure). The RF power source 182 may include an RF generator and a matching circuit, for example, to minimize reflected RF energy reflected back to the RF generator during operation. For example, RF energy supplied by the RF power source 182 may range in frequency from about 13.56 MHz and to about 162 MHz or above. For example, non-limiting frequencies such as 13.56 MHz, 27.12 MHz, 60 MHz, or 162 MHz can be used.

The electrode 154 may be cylindrical or otherwise rod-like and may be aligned with a central axis 186 of the PVD process chamber 100 (e.g., the electrode 154 may be coupled to the target assembly at a point coincident with a central axis of the target, which is coincident with the central axis 186). The electrode 154, aligned with the central axis 186 of the PVD process chamber 100, facilitates applying RF energy from the RF power source 182 to the target 114 in an axisymmetrical manner (e.g., the electrode 154 may couple RF energy to the target at a "single point" aligned with the central axis of the PVD process chamber). The central position of the electrode 154 helps to eliminate or reduce deposition asymmetry in substrate deposition processes. The electrode 154 may have any suitable diameter, however, the smaller the diameter of the electrode 154, the closer the RF energy application approaches a true single point. For example, although other diameters may be used, in some embodiments, the diameter of the electrode 154 may be about 0.5 to about 2 inches. The electrode 154 may generally have any suitable length depending upon the configuration of the PVD process chamber. In some embodiments, the electrode may have a length of between about 0.5 to about 12 inches. The electrode 154 may be fabricated from any suitable conductive material, such as aluminum, copper, silver, or the like.

The electrode 154 may pass through an opening in the grounding plate 156 and is coupled to a source distribution plate 158. The grounding plate 156 may comprise any suitable conductive material, such as aluminum, copper, or the like. The RF energy may be provided in a more symmetric and uniform manner as compared to conventional PVD process chambers due, at least in part, to the central position of the electrode 154.

One or more portions of a magnetron assembly 196 may be disposed at least partially within the cavity 170. The magnetron assembly provides a rotating magnetic field proximate the target 104 to assist in plasma processing within the process chamber 104. In some embodiments, the magnetron assembly 196 may include an inner rotating mechanism and an outer lifting mechanism. The inner rotating mechanism may include a motor 176, a motor shaft 174, a gearbox 178, and a rotatable magnet (e.g., a plurality of magnets 188 coupled to a magnet support member 172). In some embodiments, the rotatable magnet may also include one or more shunt blocks as will be described below.

The magnetron assembly 196 is rotated within the cavity 170. For example, in some embodiments, the motor 176, motor shaft 174, gear box 178, and gearbox shaft 184 may be provided to rotate the magnet support member 172. In some embodiments (not shown), the magnetron drive shaft may be disposed along the central axis of the chamber, with the RF energy coupled to the target assembly at a different location or in a different manner. As illustrated in FIG. 1, in some embodiments, the motor shaft 174 of the magnetron may be disposed through an off-center opening in the grounding plate 156. The end of the motor shaft 174 protruding from the grounding plate 156 is coupled to a motor 176. The motor shaft 174 is further disposed through a corresponding off-center opening through the source distribution plate 158 and coupled to a gear box 178.

The inner rotating mechanism rotates magnet support member 172 and the plurality of magnets 188 target to assist in plasma processing within the process chamber 104. The outer lifting mechanism may include one or more actuators 118 coupled to one or more lifting shafts 119. In some embodiments, the one or more actuators may be a motor or a linear slide mechanism. The bottom portion of each lifting shaft 119 is coupled to a stator 173. The stator may be an annular disk or ring that has a plurality of magnets 189 attached on a bottom portion of the stator. The outer lifting mechanism serves to raise and lower the plurality of magnets 189 to assist in plasma processing within the process chamber 104. The outer lifting mechanism may also include bellows 190 about each lifting shaft 119.

The magnet support member 172 and the stator 173 may be constructed from any material suitable to provide adequate mechanical strength to rigidly support the plurality of magnets 188 and 189. For example, in some embodiments, the magnet support member 172 and the stator 173 may be constructed from a non-magnetic metal, such as non-magnetic stainless steel. The magnet support member 172 stator 173 may have any shape suitable to allow the plurality of magnets 188, 189 to be coupled thereto in a desired position. For example, in some embodiments, the magnet support member 172 and stator 173 may comprise a plate, a disk, a cross member, or the like. The plurality of magnets 188, 189 may be configured in any manner to provide a magnetic field having a desired shape and strength to provide a more uniform full face erosion of the target as described herein.

Alternatively, the magnet support member 172 may be rotated by any other means with sufficient torque to overcome the drag caused on the magnet support member 172 and attached plurality of magnets 188, for example due to the cooling fluid, when present, in the cavity 170. For example, in some embodiments, (not shown), the inner rotating mechanism of the magnetron assembly 196 may be rotated within the cavity 170 using a motor 176 and motor shaft 174 disposed within the cavity 170 and directly connected to the magnet support member 172 (for example, a pancake motor). The motor 176 is sized sufficiently to fit within the cavity 170, or within the upper portion of the cavity 170 when the divider 194 is present. The motor 176 may be an electric motor, a pneumatic or hydraulic drive, or any other process-compatible mechanism that can provide the torque. In some embodiments (not shown), the magnetron drive shaft may be disposed along an offset axis of the chamber, with the RF energy coupled to the target assembly at a different location or in a different manner.

Figure 2A:
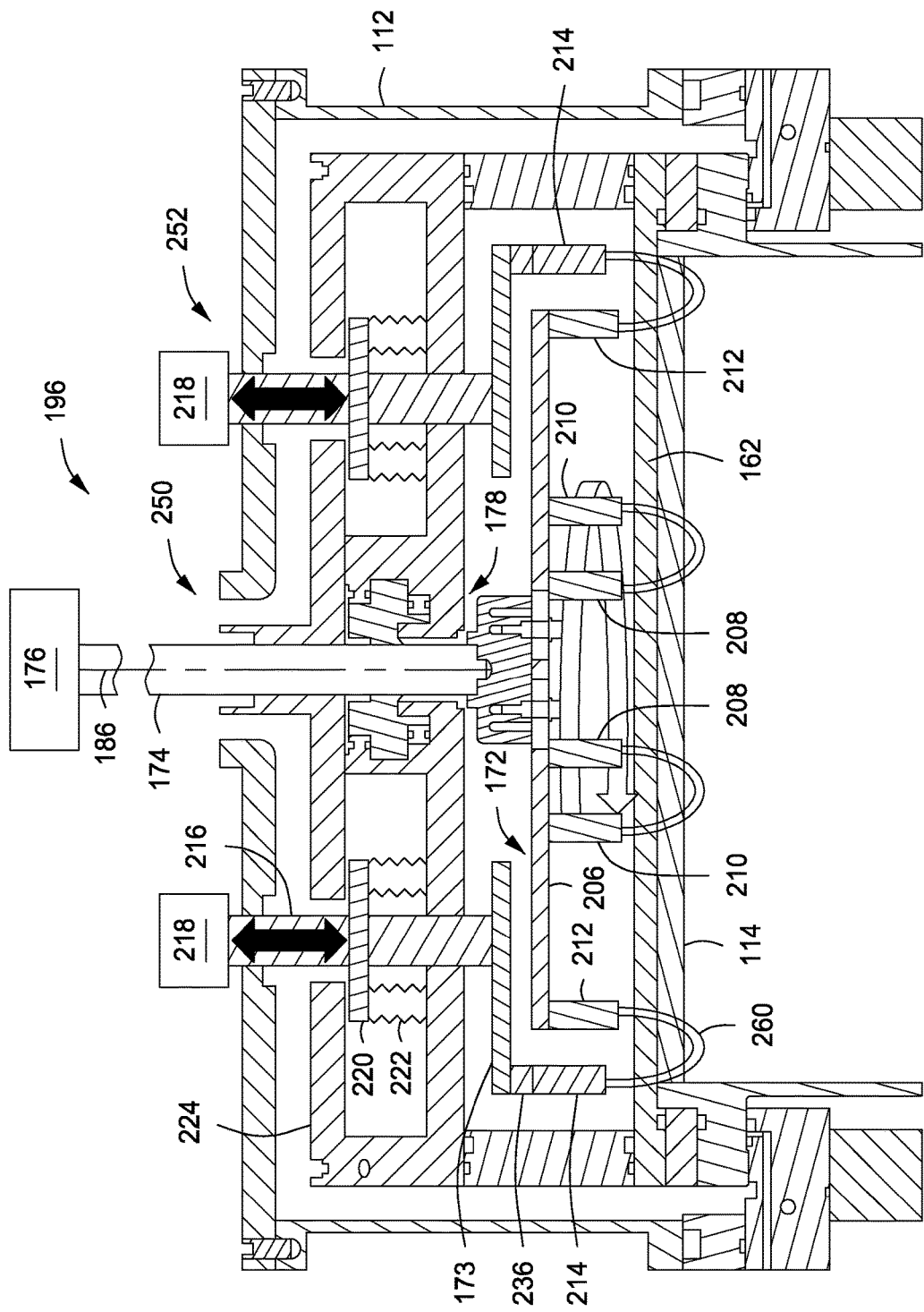
FIG. 2A is a cross-sectional view of a chamber lid having a magnetron assembly in accordance with some embodiments of the present disclosure.
Figure 2B:
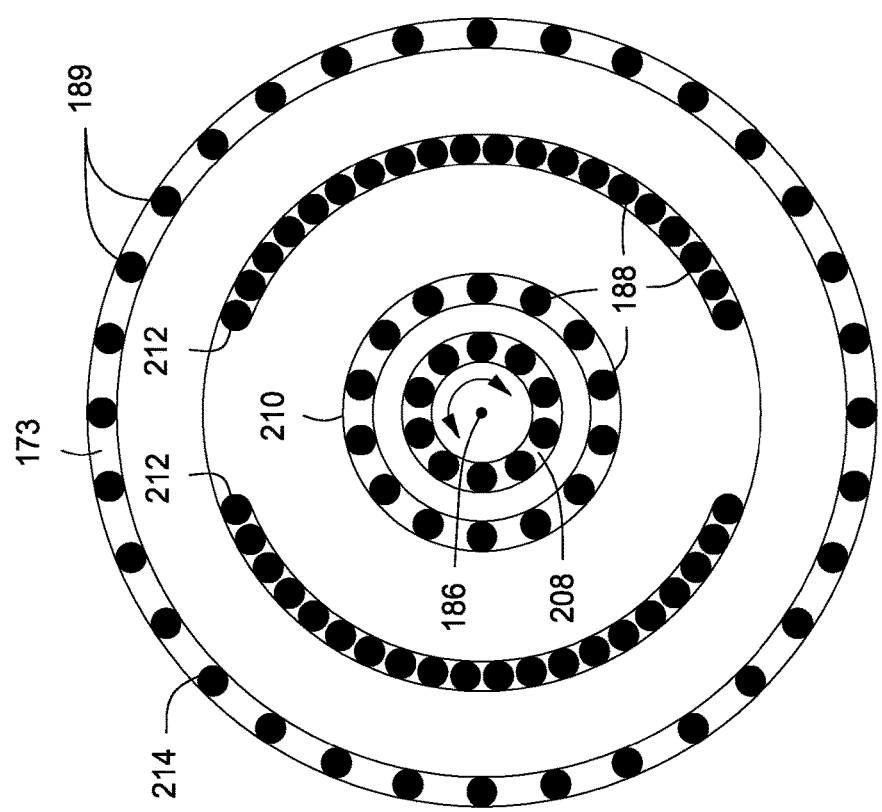
FIG. 2B is a cross-sectional bottom view of a magnet assembly in accordance with some embodiments of the present disclosure.

FIG. 2A depicts a cross-sectional view of a chamber lid 101 of an exemplary PVD process chamber 100 including a magnetron assembly 196. FIG. 2B depicts a bottom perspective view of a magnet assembly. The magnetron assembly 196 includes an inner rotating mechanism 250 and an outer lifting mechanism 252. The inner rotating mechanism 250 includes motor 176 coupled to shaft 174, which are configured to rotate magnet support member 172 using gearbox 178. In some embodiments, the magnet support member 172 spins about a central axis 186. As shown in FIG. 2, the magnet support member 172, which serves as a structural base for the inner rotating magnet assembly, has a plurality of magnet s coupled thereto. The magnet support member 172 may be fabricated of a suitable material to be a shunt plate that shunts the magnetic field. The magnet support member may also include a central opening and a mounting plate for mounting the magnet support member 172 to a shaft to provide rotation of the magnetron during use, for example, such as the rotation shaft 174 as shown in FIG. 1. The magnet support member 172 may also have cut-outs or material removed between sets of magnets to reduce the mass of the magnet support member 172.

The plurality of magnets may be arranged into a plurality of distinct pairs of open loop magnetic poles, or magnetic tracks 208, 210, 212, coupled to a backside 206 of the magnet support member 172. The magnetic tracks 208, 210, 212 may be coupled to the magnet support member 172, for example, via a plurality of mounting holes formed in the magnet support member 172. In the embodiment depicted in FIGS. 2A and 2B a first pair of magnetic tracks 208, 210 is shown. Magnetic track 212 may be paired with magnetic track 214 couple to the outer lifting mechanism when lowered into position.

Specifically, outer lifting mechanism 252 may include one or more actuators 218 coupled to a lifting shaft 216 that raises and lowers stator 173 with magnetic track 214 attached to a bottom surface of state or 173. In some embodiments, a spacer or support member 236 may attach magnetic track 214, and the plurality of magnets 189 included in magnetic track 214, to stator 173. By adjusting the height of magnetic track 214 with respect to the magnetic track 212 disposed along an outer edge of magnet support member 172, the edge field can be tuned. That is, the magnetic field 260 produced by the interaction of magnetic tracks 212 and 214 can be tuned to control plasma coverage generated below target 114. Thus, as the inner rotating mechanism spins, the outer lifting mechanism may raise or lower magnetic track 214 into position as desired. In some embodiments the poles between 212 and 214 may be the same or opposite to produce the desired magnetic field through target 114.

In some embodiments, a bellows assembly including bellows 222 and plate 220 may be disposed about each lifting shaft 216 to provide a seal about shaft 216. The bellows may be disposed in housing 224.

The magnetic tracks are spaced from near the center to their the edge. By providing a plurality of magnetic tracks spaced on the magnet support member 172, a magnetic field may be produced the covers or substantially covers the full face of the target. In some embodiments, the magnetic tracks may be curved and may have a fixed radius. In some embodiments the magnetic tracks may have a varying radius. In any of the embodiments described herein, the magnetic tracks may be linear rather than curved.

As shown in FIGS. 2A and 2B, the plurality of magnetic tracks may generally be positioned with one pair magnetic track near the center of the magnet support member 172 (e.g., near the center of the target source material 113), and one magnetic track in a position corresponding to the outer edge of the target source material 113. In some embodiments, the magnetic track positioned near the center may have the poles disposed on either side of the center of the magnet support member, but with neither pole directly over the center. Any additional magnetic tracks may be positioned to fill the spaces in between the center and edge.

In some embodiments, the magnetic tracks may have a length that varies as a function of the radial location of the track. In some embodiments, a ratio of track length to the radial distance of the track from the center of the magnet support member 172 is substantially equal for each of the magnetic tracks. This may advantageously provide a more uniform erosion of the target.

In some embodiments, the magnetic field provided by the magnetron is relatively weak, meaning just strong enough to provide confinement. For use with magnetic target materials, the magnetic field may be stronger, and for use with non-magnetic target materials, the magnetic field may be weaker. Similarly, the spacing between pairs of poles in a given track may be selected based upon the overall thickness of the target (e.g., the target source material 113 the backing plate 162). In some embodiments, the overall thickness of the target may be about one inch. The spacing may be selected such that the magnetic field extends just to the face of the target source material 113, or slightly into the processing volume beyond the face of the target source material 113.

Generally, the plurality of magnets 188, 189 may be fabricated from a ferromagnetic material, such as in a non-limiting example, 400-series stainless steel or other suitable materials. The polar orientation, or polarity (e.g., north or south), within a given track in any pair of open loop magnetic poles is the same (e.g., the magnets within a given open loop magnetic pole track have a common polar orientation), but the polarity between pairs of magnetic tracks is opposite (e.g., inner north and outer south or inner south and outer north).

Figure 3:
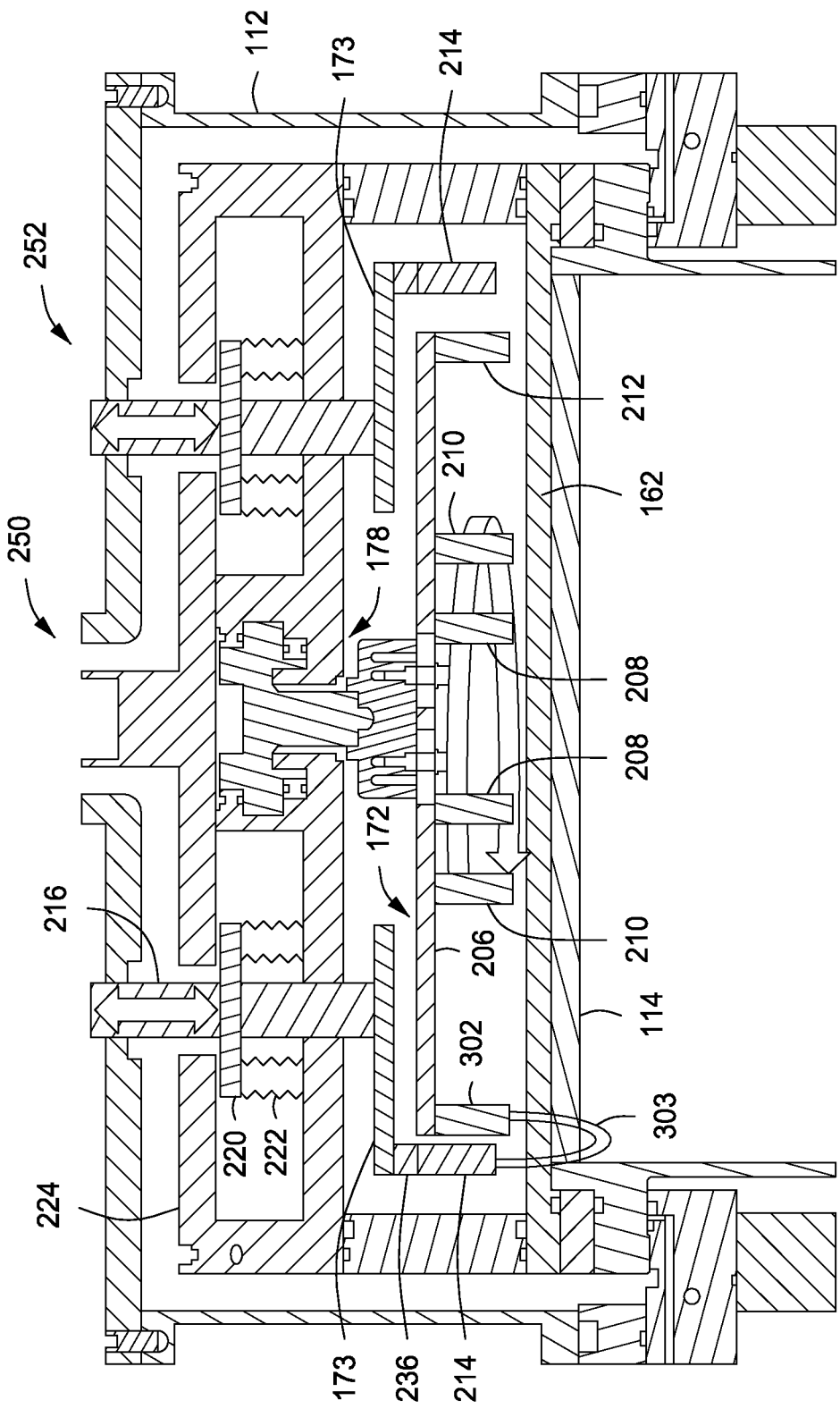
FIG. 3 is a cross-sectional view of a chamber lid having a magnetron assembly including a shunt block in accordance with some embodiments of the present disclosure.

In some embodiments, a magnetic track 212 may be disposed on one side of magnet support member 172, which a shunt 302 may be attached to an opposite side of magnet support member 172 as shown in FIG. 3. The shunt 302 blocks the edge magnetic field 303 created by the outer pole magnetic track 214.

Figure 4A:
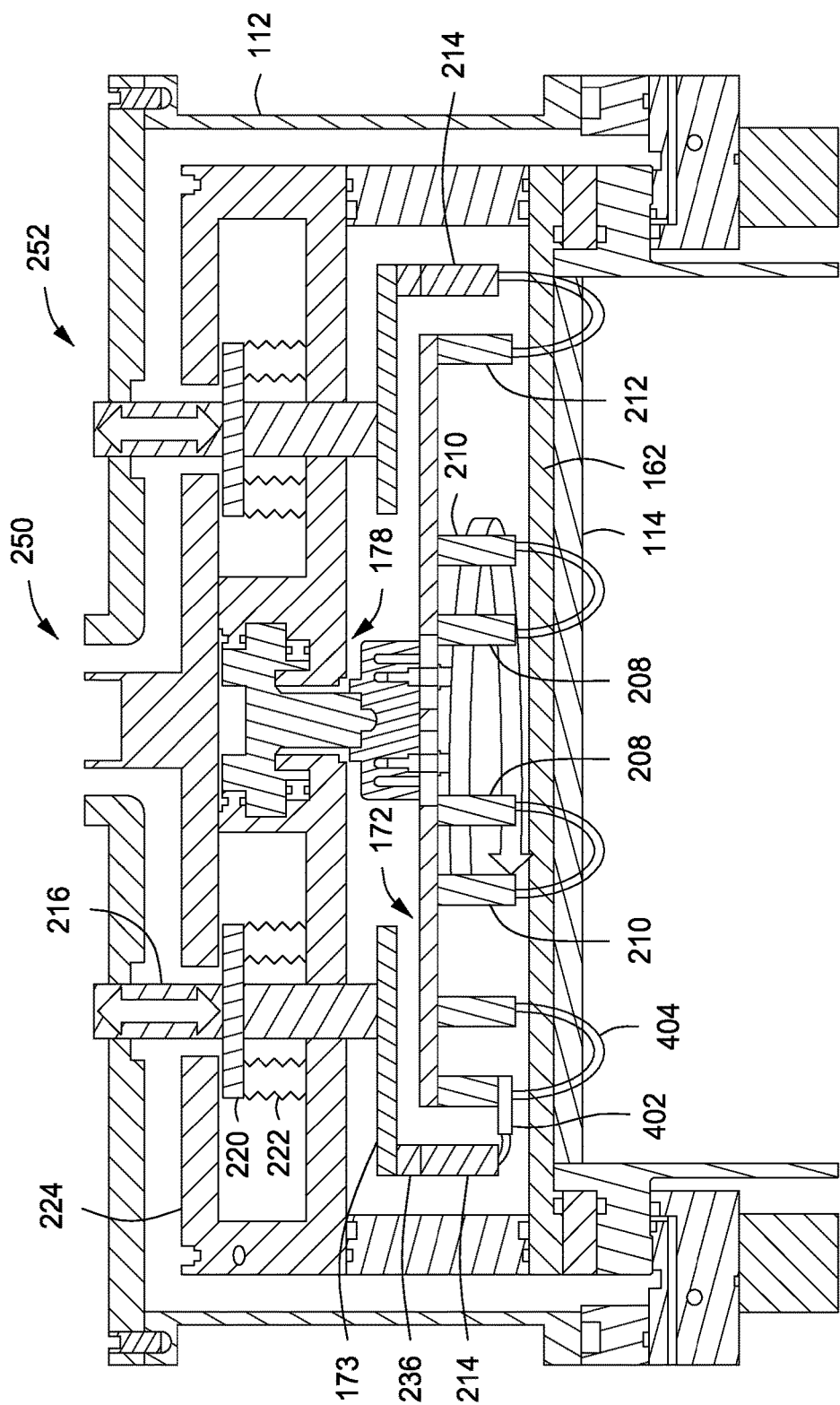
FIG. 4A is a cross-sectional view of a chamber lid having a magnetron assembly with a shunt plate in accordance with some embodiments of the present disclosure.
Figures 4B, 4C, 4D:
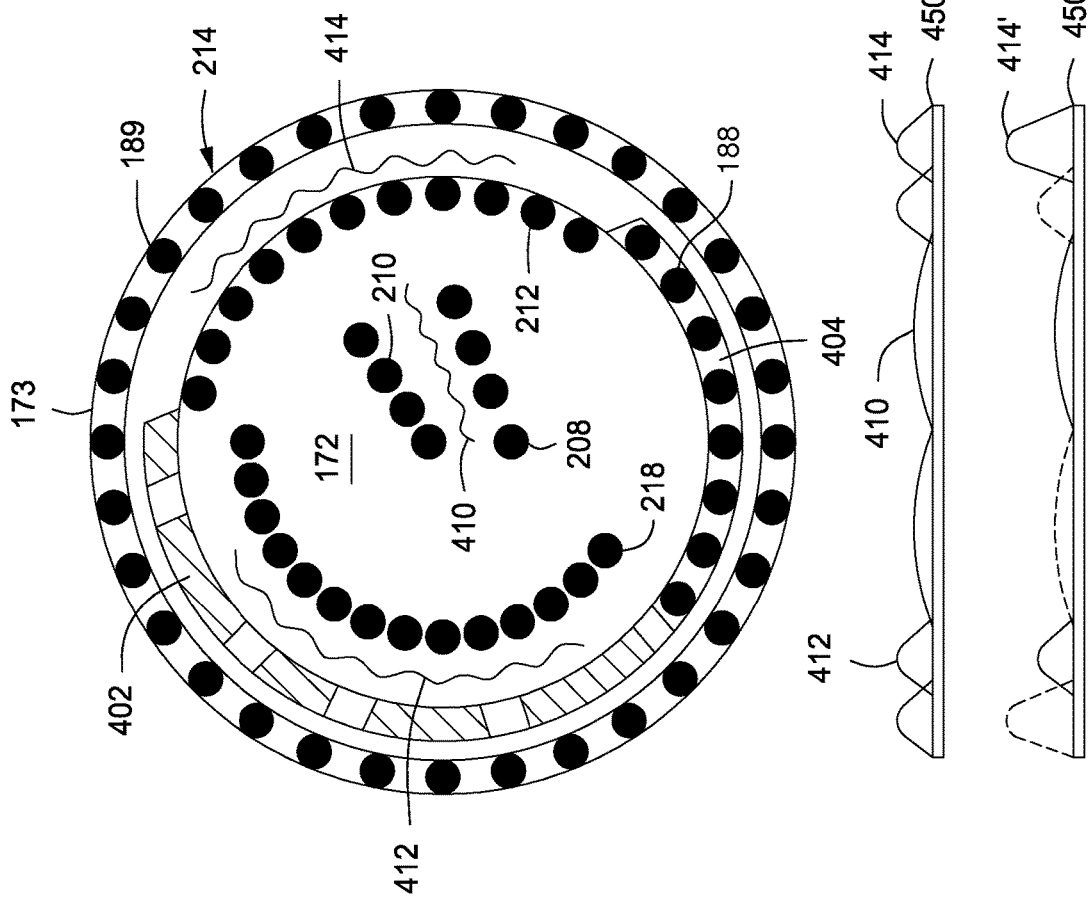
FIG. 4B is a cross-sectional bottom view of a magnet assembly including a shunt plate in accordance with some embodiments of the present disclosure.
FIGS. 4C and 4D depict target erosion tracks in accordance with some embodiments of the present disclosure.

In some embodiments, a rotating shunt plate 402 may be attached to magnet support member 172 to block the edge field created by the outer pole magnetic track 214 as shown in FIGS. 4A and 4B. For example, as shown in FIGS. 4A and 4B, shunt plate 402 may bring the magnetic field 403 from the outer pole (i.e., magnetic track 214) towards the center. Also shown in FIG. 4B, is a magnetic plate 404 that cancels the magnetic field locally using ferrous blocks or opposite polarity magnets 306.

FIGS. 4B, 4C and 4D also depict three main erosion tracks at different radii of the target 450, 450'. Specifically, the erosion rate of the target follows field concentration between the poles (i.e., between magnetic tracks). For example, in FIGS. 4B and 4C, erosion track 410 affects erosion of the target along the center portion of the target 450. Meanwhile erosion track 412 affects erosion of the target between the center of the target in the edge of the target. Finally, erosion track 414 affects corrosion at the edge of the target 450. FIG. 4D depicts the effects of the outer lifting mechanism 252 on target erosion. Specifically, the raising and lowering of magnetic track 214 along the outer periphery of the inner rotating mechanism, causes erosion track 414' on target 450' as shown in FIG. 4D.

While the foregoing is directed to embodiments of the present disclosure, other and further embodiments of the disclosure may be devised without departing from the basic scope thereof.

The invention claimed is:

1. A magnetron assembly for providing a magnetic field within a process chamber, comprising:
    an inner rotating mechanism including a first plate having a central axis, wherein the first plate includes a first pair of two magnet tracks disposed proximate a center portion of the first plate, and a second single magnet track disposed about a peripheral edge of the first plate, wherein each of the first pair of two magnet tracks and the second single magnet track includes a plurality of magnets, and wherein the first plate is rotatable about the central axis; and
    an outer lifting mechanism including a ring disposed proximate the first plate, the ring having a single magnet track including a second plurality of magnets coupled to a bottom surface of the ring proximate a peripheral edge of the ring, wherein the ring is movable in a direction perpendicular to the first plate, wherein a polarity of each magnet within each individual magnet track is the same, and wherein a polarity between the two magnet tracks in the first pair of two magnet tracks is opposite.

2. The magnetron assembly of claim 1, wherein the ring is movable between a lowered position and a raised position.

3. The magnetron assembly of claim 2, wherein the second plurality of magnets disposed on the ring align with the second single magnet track disposed on the first plate to form a second pair of two magnet tracks when the ring is in the lowered position, and wherein the second plurality of magnets do not align with the second single magnet track when the ring is in the raised position.

4. The magnetron assembly of claim 2, wherein at least one of a shunt block or a shunt plate is coupled to the first plate proximate an outer edge of the first plate.

5. The magnetron assembly of claim 4, wherein the second plurality of magnets align with the at least one of the shunt block or shunt plate when the ring is in the lowered position, and wherein the second plurality of magnets do not align with the at least one of the shunt block or shunt plate when the ring is in the raised position.

6. The magnetron assembly of claim 1, wherein a shunt is coupled to the second single magnet track.

7. The magnetron assembly of claim 1, wherein the outer lifting mechanism includes at least one lift shaft coupled to the ring, and an actuator coupled to each lift shaft.

8. The magnetron assembly of claim 7, wherein the actuator is one of a motor or a sliding linear mechanism.

9. The magnetron assembly of claim 7, wherein bellows disposed about each lift shaft to seal the lift shaft.

10. The magnetron assembly of claim 1, wherein the first pair of two magnet tracks and the second single magnet track are coupled to a bottom surface of the first plate, and wherein the second plurality of magnets are couple to a bottom surface of the ring.

11. The magnetron assembly of claim 1, wherein the first plate is concentric with the ring.

12. The magnetron assembly of claim 1, further comprising:
    a first shaft coupled to the first plate about the central axis of the first plate, wherein the first shaft is disposed through a central opening of the ring.

13. The magnetron assembly of claim 12, wherein the first plate is configured to rotate about the first shaft to align the second single magnet track and the second plurality of magnets when the ring is in a lowered position.

14. A substrate processing system, comprising:
    a process chamber having an inner volume and a substrate support disposed therein;
    a target disposed in an upper portion of the inner volume opposing the substrate support; and
    a magnetron assembly disposed proximate a back surface of the target on a side opposite the substrate support, the magnetron assembly comprising:
        an inner rotating mechanism including a first plate having a central axis, wherein the first plate includes a first pair of two magnet tracks disposed proximate a center portion of the first plate, and a second single magnet track disposed about a peripheral edge of the first plate, wherein each of the first pair of two magnet tracks and the second single magnet track includes a plurality of magnets, and wherein the first plate is rotatable about the central axis; and
        an outer lifting mechanism including a ring disposed proximate the first plate, the ring having a single magnet track including a second plurality of magnets coupled to the ring proximate a peripheral edge of the ring, wherein the ring is movable in a direction perpendicular to the first plate, wherein a polarity of each magnet within each individual magnet track is the same, and wherein a polarity between the two magnet tracks in the first pair of two magnet tracks is opposite.

15. The substrate processing system of claim 14, wherein the ring is movable between a lowered position and a raised position.

16. The substrate processing system of claim 15, wherein the second plurality of magnets disposed on the ring align with the second single magnet track disposed on the first plate to form a second pair of two magnet tracks when the ring is in the lowered position, and wherein the second plurality of magnets do not align with the second single magnet track when the ring is in the raised position.

17. The substrate processing system of claim 14, wherein the outer lifting mechanism includes at least one lift shaft coupled to the ring, and an actuator coupled to each lift shaft.

18. The magnetron assembly of claim 1, wherein a polarity of each magnet within the second plurality of magnets disposed on the ring is the same, and wherein a polarity of the second plurality of magnets disposed on the ring is opposite of a polarity of the second single magnet track disposed on the first plate.

19. The substrate processing system of claim 14, wherein a polarity of each magnet within the second plurality of magnets disposed on the ring is the same, and wherein a polarity of the second plurality of magnets disposed on the ring is opposite of a polarity of the second single magnet track disposed on the first plate.

* * * * *